United States Patent
Shih et al.

(10) Patent No.: US 10,168,611 B2
(45) Date of Patent: Jan. 1, 2019

(54) MASK WITH MULTILAYER STRUCTURE AND MANUFACTURING METHOD BY USING THE SAME

(71) Applicant: Taiwan Semiconductor Manufacturing Company, Ltd., Hsinchu (TW)

(72) Inventors: Chih-Tsung Shih, Hsinchu (TW); Jeng-Horng Chen, Hsin-Chu (TW); Shinn-Sheng Yu, Hsinchu (TW); Anthony Yen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 31 days.

(21) Appl. No.: 15/678,844

(22) Filed: Aug. 16, 2017

(65) Prior Publication Data

US 2017/0343892 A1    Nov. 30, 2017

Related U.S. Application Data

(63) Continuation of application No. 14/801,914, filed on Jul. 17, 2015, now Pat. No. 9,766,536.

(51) Int. Cl.
*G03F 1/22* (2012.01)
*G03F 1/24* (2012.01)
*G03F 7/20* (2006.01)

(52) U.S. Cl.
CPC .............. *G03F 1/22* (2013.01); *G03F 1/24* (2013.01); *G03F 7/2004* (2013.01)

(58) Field of Classification Search
CPC ............. G03F 1/22; G03F 1/24; G03F 7/2004
USPC .......................................................... 430/5
See application file for complete search history.

(56) References Cited

U.S. PATENT DOCUMENTS

| | | | |
|---|---|---|---|
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 2005/0111083 A1 | 5/2005 | Yakshin et al. |
| 2006/0147818 A1 | 7/2006 | Lee |
| 2009/0147364 A1 | 6/2009 | Kotoku et al. |
| 2010/0266938 A1 | 10/2010 | Hosoya |
| 2012/0250144 A1 | 10/2012 | Ehm et al. |
| 2013/0038929 A1 | 2/2013 | Muellender et al. |
| 2013/0115547 A1 | 5/2013 | Mikami et al. |
| 2013/0202992 A1 | 8/2013 | Chen et al. |
| 2015/0286146 A1 | 10/2015 | Chang et al. |
| 2015/0309405 A1 | 10/2015 | Shih et al. |
| 2015/0311075 A1 | 10/2015 | Huang et al. |

FOREIGN PATENT DOCUMENTS

| | | |
|---|---|---|
| DE | 102014200932 A1 | 7/2015 |
| JP | 2005-049122 A | 2/2005 |
| KR | 20060080309 A | 7/2006 |
| KR | 10-2008-0036774 A | 4/2008 |
| TW | 200941148 A | 10/2009 |
| TW | 201414996 A | 4/2014 |
| TW | 201435481 A | 9/2014 |
| TW | 201502061 A | 1/2015 |
| TW | 201525607 A | 7/2015 |
| WO | WO 2012/014904 A1 | 2/2012 |
| WO | WO 2015/075214 A1 | 5/2015 |

*Primary Examiner* — Christopher G Young
(74) *Attorney, Agent, or Firm* — Haynes and Boone, LLP

(57) ABSTRACT

The present disclosure provides a photolithography mask. The photolithography mask includes a substrate that contains a low thermal expansion material (LTEM). A multilayer (ML) structure is disposed over the substrate. The ML structure is configured to reflect radiation. The ML structure contains a plurality of interleaving film pairs. Each film pair includes a first film and a second film. The first film and the second film have different material compositions. Each film pair has a respective thickness. For at least a subset of the plurality of the film pairs, the respective thicknesses of the film pairs change randomly along a predefined direction.

20 Claims, 6 Drawing Sheets

MASK WITH MULTILAYER STRUCTURE AND MANUFACTURING METHOD BY USING THE SAME

PRIORITY DATA

This application is a continuation of U.S. patent application Ser. No. 14/801,914, filed Jul. 17, 2015, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics. i.e., mirrors instead of lenses. EUV scanners provide the desired pattern on an absorption layer ("EUV" mask absorber) formed on a reflective mask. Currently, binary intensity masks (BIM) are employed in EUVL for fabricating integrated circuits. EUVL is similar to optical lithography in that it needs a mask to print wafers, except that it employs light in the EUV region. i.e., at 13.5 nm. At the wavelength of 13.5 nm or so, all materials are highly absorbing. Thus, reflective optics rather than refractive optics is used. A multilayered (ML) structure is used as a EUV mask blank.

However, conventional EVU masks and the fabrication thereof may still have drawbacks. For example, the ML structure in conventional EUV masks is a periodic structure, which may include 40 pairs of silicon and molybdenum. Each pair of silicon and molybdenum has the same thickness as the rest of the pairs. The periodic ML structure may lead to low reflectivity and diffraction imbalance, which are undesirable.

Therefore, while conventional EUV lithography systems and processes have been generally adequate for their intended purposes, they have not been entirely satisfactory in every aspect. What is needed is a EUV lithography method and system having improved reflectivity and diffraction balance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
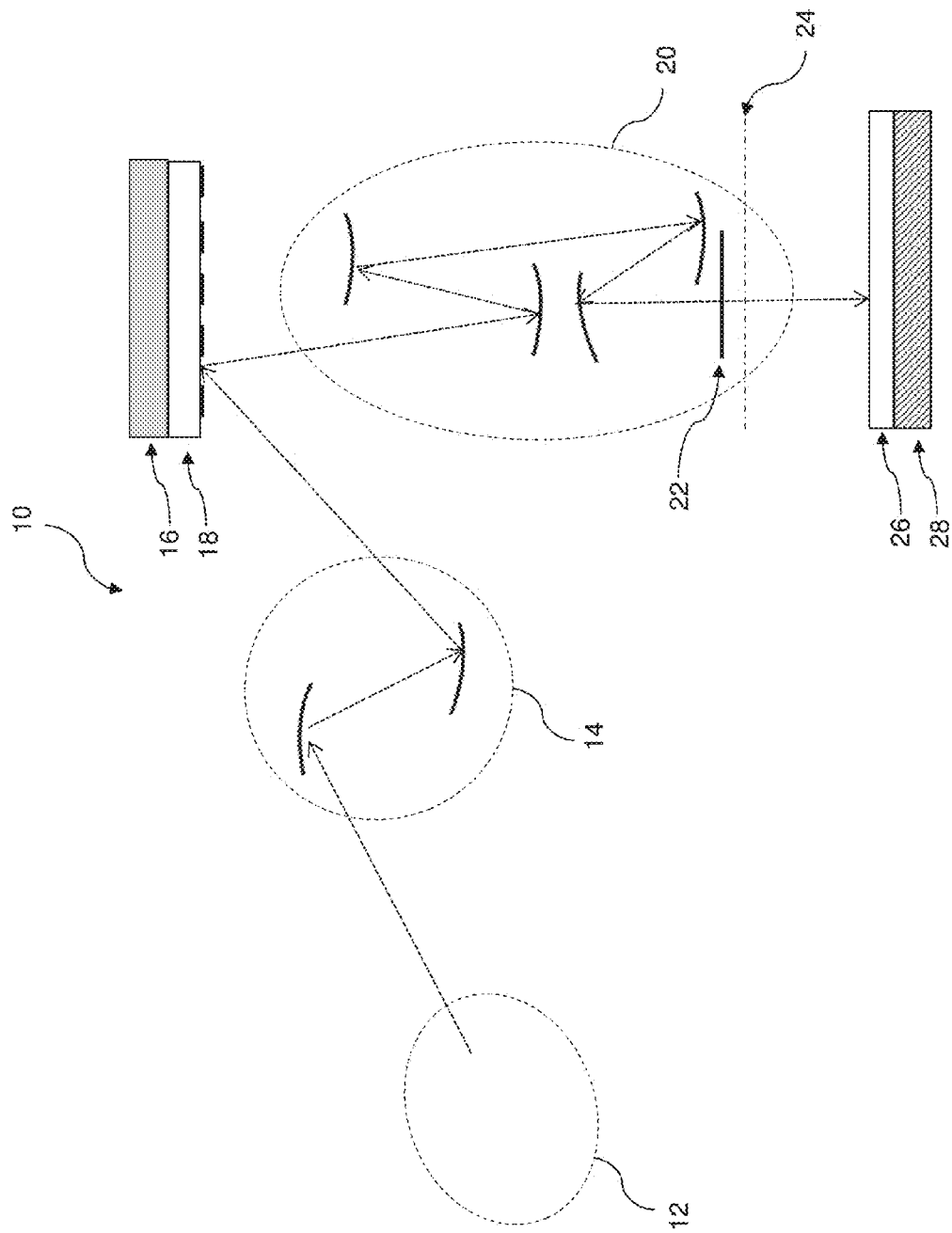
FIG. 1 is a schematic view of a lithography system constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view diagram of a lithography system 10, constructed in accordance with some embodiments. The lithography system 10 may also be generically referred to as a scanner that is operable to perform lithography exposure processes with respective radiation source and exposure mode. In the present embodiment, the lithography system 10 is an extreme ultraviolet (EUV) lithography system designed to expose a resist layer by EUV light. The resist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. Conventionally, the Mo/Si film pairs or Mo/Be film pairs in EUV masks are distributed periodically. In other words, each film pair has substantially equal thickness as each of the other film pairs. According to the various aspects of the present disclosure, however, the ML structure includes aperiodic film pairs to improve reflectivity and diffraction balance, as discussed in greater detail below.

The mask 18 may further include a capping layer, such as ruthenium (Ru), disposed on the ML for protection. The mask 18 further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as a EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC)

onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
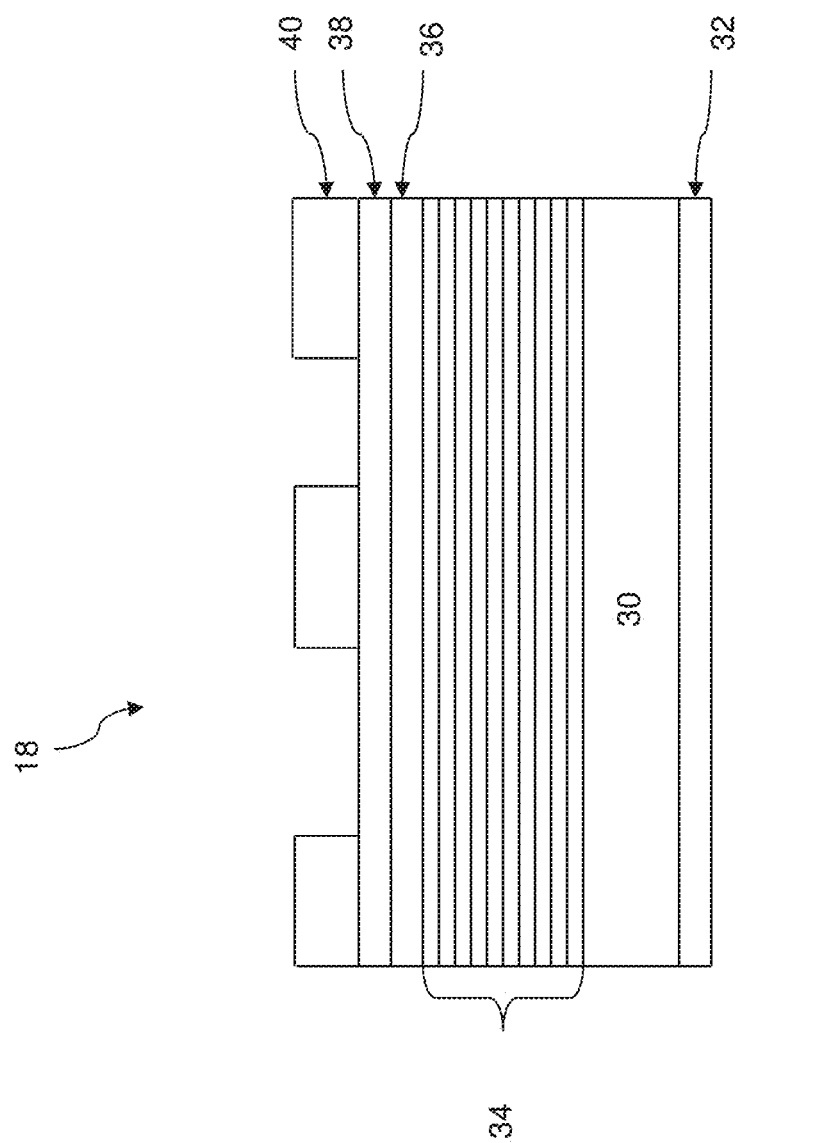
FIG. 2 is a sectional view of a EUV mask constructed in accordance with some embodiments.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The EUV mask 18 includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths. As discussed above, the ML structure in conventional EUV masks utilize periodic Mo/Si or Mo/Be film pairs, which may lead to insufficient reflectivity and/or excessive diffraction imbalance. To remedy these shortcomings, the ML structure 34 of the present disclosure utilizes aperiodic film pairs, as discussed below in greater detail with reference to FIG. 3.

Still referring to FIG. 2, the EUV mask 18 also includes a capping layer 36 disposed over the ML structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 3:
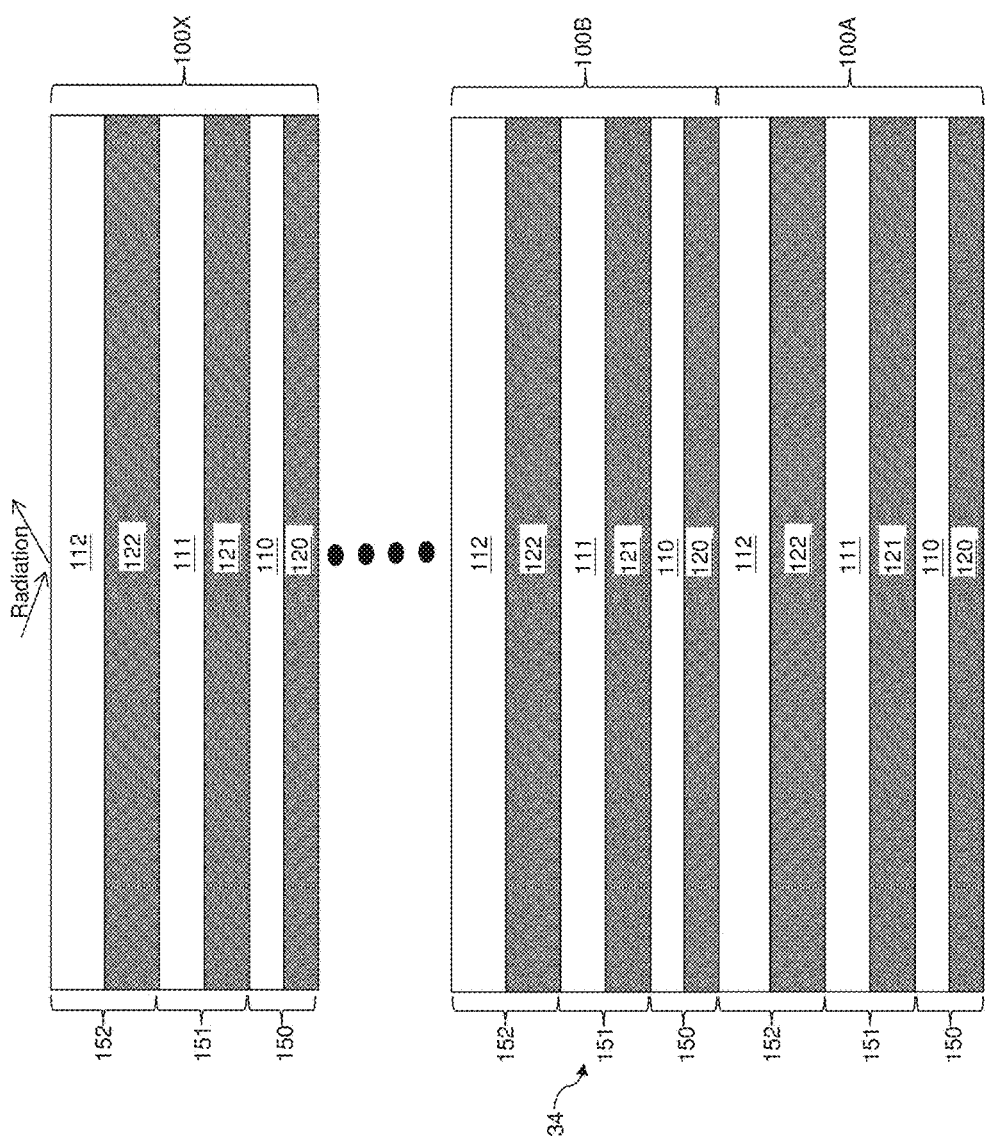
FIG. 3 is a sectional view of a multilayer structure of the EUV mask constructed in accordance with some embodiments.

Referring now to FIG. 3, the aperiodic ML structure 34 of the present disclosure is described in more detail. FIG. 3 illustrates a diagrammatic fragmentary cross-sectional side view of a portion of the aperiodic ML structure 34. The aperiodic ML structure 34 includes a plurality of pairs of Mo/Si films or layers. Radiation such as light in the EUV range is projected toward the topmost surface of the aperiodic ML structure 34 in FIG. 3. In the embodiment illustrated in FIG. 3, the pairs of Mo/Si films are divided into groups or subsets, wherein the period (measured by thickness) gradually or randomly changes within each group or subset.

For example, the ML structure 34 includes a group 100A that contains three pairs of Mo/Si film. The first pair of Mo/Si film includes a Si film 110 disposed on a Mo film 120. The second pair of Mo/Si film includes a Si film 111 disposed on a Mo film 121. The third pair of Mo/Si film includes a Si film 112 disposed on a Mo film 122. As is illustrated, the third pair of Mo/Si film 112/122 is disposed over the second pair of Mo/Si film 111/121, which is disposed over the first pair of Mo/Si film 110/120.

The first pair of Mo/Si film has a total thickness 150. The second pair of Mo/Si film has a total thickness 151. The third pair of Mo/Si film has a total thickness 152. According to the various aspects of the present disclosure, the thickness 150, 151, and 152 of the first, second, and third Mo/Si film pairs change gradually or randomly along a predefined direction, for example along a vertical direction in FIG. 3, which in FIG. 3 may be defined as the direction in which the various films are disposed on top of one another.

In some embodiments, the thickness 151 is equal to d, the thickness 150 is in a range from about 0.5 d to d, and the thickness 152 is in a range from about d to 1.5 d. In some other embodiments, the thickness 151 is equal to d, the thickness 150 is in a range from about 0.8 d to d, and the thickness 152 is in a range from about d to 1.2 d. In yet other embodiments, the thickness 151 is equal to d, the thickness 150 is equal to about 0.86 d, and the thickness 152 is equal to about 1.05 d. In these embodiments, d is a thickness value, for example 7 nanometers (nm).

These numeric ranges discussed above are configured to improve the reflectivity and diffraction balance. This is illustrated in Table 1 below, which includes experimental data of reflectivity and diffraction imbalance performance for a mask with an aperiodic ML structure versus conventional masks with a periodic ML structure.

TABLE 1

| Period (nm) | Min. Reflectivity (%) at angle (°) within 13.47° | Reflection Ripple (%) (Max R-Min R) |
|---|---|---|
| 7 | 8.5 at 15.40 | 63.83 |
| 7.07 | 35 at 16.18 | 38.31 |
| 7.14 | 51 at 0.00 | 21.38 |
| Aperiodic | 61 at 0.00 | 8.25 |

The rows 2-4 of Table 1 are data taken from conventional masks with periodic ML structures, though the period (measured by thickness of each Mo/Si pair) is different for each mask. The last row of Table 1 is data taken from an embodiment of the mask of the present disclosure, where an aperiodic ML structure is implemented. The middle column of Table 1 lists reflectivity data, measured by "Min reflectivity (%) at angle (°) within 13.47°." The right column of Table 1 lists diffraction imbalance data, measured by "Reflection Ripple (%) (Max R−Min R). As is clearly shown in Table 1, the reflectivity (at 61%) of the mask with the aperiodic ML structure is greater than the conventional masks, while the diffraction imbalance (at 8.25%) is smaller (meaning that the diffraction balance is better) than the conventional masks.

According to the various aspects of the present disclosure, the nominal thickness (d) of the film pair in aperiodic ML structure complies with the following criteria:

$$\delta = \frac{4\pi(n_H d_H \cos\theta_H + n_L d_L \cos\theta_L)}{\lambda} = 2m\pi$$

where NA (numerical aperture)*sigma/M (reduction)=sin (theta)>0.03, d=$d_H$ (thickness of higher layer)+$d_L$ (thickness of lower layer), and theta (θ) is the incident angle of the radiation source with a wavelength of lambda (λ). In some embodiments, the wavelength of lamda is 6.5 nm. In other embodiments, the wavelength of lamda is 13 nm.

In the embodiment shown in FIG. 3, the first, second, and third Mo/Si film pairs made up of films 110-112 and 120-122 may also be collectively referred to as a stack and is herein designated with the reference numeral 100A. Within the aperiodic ML structure 34, this stack of films is repeated, which as shown in FIG. 3 are designated with reference numerals 100B . . . 100X. In other words, the stack (or subset/group) 100B is made up of films 110-112 and 120-122 that are substantially similar to the corresponding films in the stack 100A, as are the stacks (such as stack 100X) disposed thereabove. In this manner, the thicknesses of the Mo/Si film pairs within the stack 100B (or stack 100X) vary gradually or randomly along the vertical direction (increasing as they go upwards in the embodiment shown in FIG. 3). For example, within the stack 100B, the Mo/Si film pair 112/122 has a greater thickness than the Mo/Si film pair 111/121, and the Mo/Si film pair 111/121 has a greater thickness than the Mo/Si film pair 110/120. Another way of describing the gradually-changing thickness of the film pairs is that, within each stack (e.g., 100A/100B/100X) of film pairs, the film pairs become thicker the farther away they are from the LTEM substrate.

Another characteristic of the configuration of the aperiodic ML structure 34 shown in FIG. 3 is that, although the thickness of the Mo/Si film pairs increases in the upwards vertical direction within a specific stack 100A/100B/100C, the thickness would actually decrease at an interface between two adjacent stacks. For example, the topmost Mo/Si film pair (constituting films 112/122) of the stack 100A has a thickness 152, which as discussed above is greater than d. The bottommost Mo/Si film pair (constituting films 110/120) of the stack 100B has a thickness 150 and forms an interface with the topmost Mo/Si film pair of the stack 100A. As discussed above, the thickness 150 is less than d and is therefore less than the thickness 152. This illustrates that, although the thickness of the Mo/Si film pairs gradually or randomly increases in the upwards vertical direction within any stack 100A/100B, etc., such thickness would drop after "crossing over" to the next stack disposed thereabove. In other words, the thickness of the Mo/Si film pairs within the aperiodic ML structure 34 would gradually increase in the upwards vertical direction, and then it would drop (e.g., upon entering the stack located above), and then gradually increase again, and then drop, etc. This pattern repeats until the outermost surface (the outer surface of the film 112 in the stack 100X in this case) of the aperiodic ML structure 34 has been reached.

It is understood that the stack 100A/100B/100X discussed above need not be limited to three film pairs. For example, in some embodiments, each stack (or subset or group) of Mo/Si film pairs may include four, five, six, or any other number of film pairs, as long as the Mo/Si film pair thickness is gradually or randomly changing within the stack along the vertical direction. In an extreme example, the entire aperiodic structure 34 is made up of Mo/Si film pairs having gradually or randomly changing thicknesses along the vertical direction. In other words, the entire aperiodic structure 34 may be viewed as a single stack 100A as discussed above.

It is also understood that although the above discussions use Mo/Si as an example film pair for the aperiodic ML structure, the film pair materials are not limited to Mo/Si. For example, Mo/Be may be used as a suitable film pair in place of Mo/Si. It is also understood that the various aspects of the present disclosure are not limited to EUV lithography. For example, they may also apply to Beyond Extreme Ultraviolet (BEUV) lithography as well, where the radiation wavelength is 6.x nm (e.g., 6.5 nm) instead of 13.5 nm used in EUV lithography.

Figure 4:
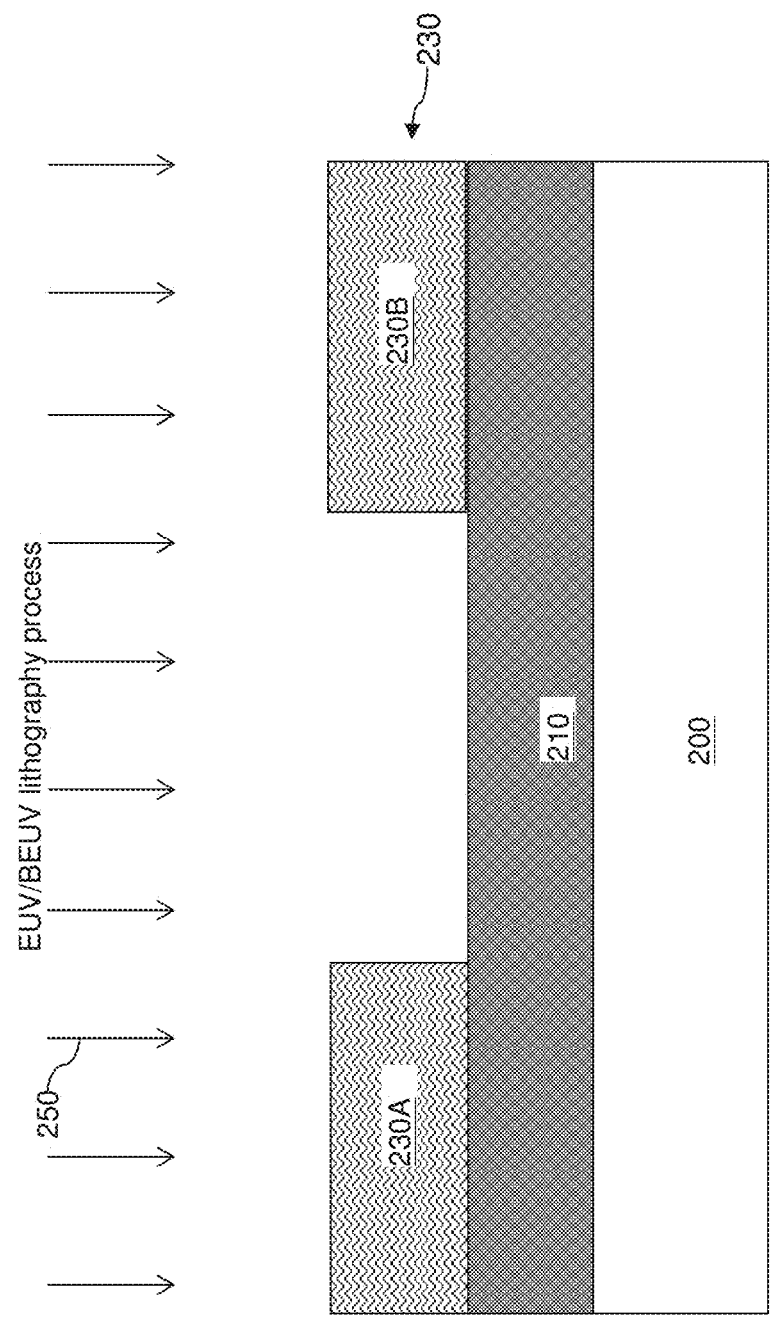
FIG. 4 is a sectional view of a semiconductor wafer undergoing processing in accordance with some embodiments.

FIG. 4 is a diagrammatic fragmentary cross-sectional side view of a semiconductor wafer undergoing a lithography process according to the various aspects of the present disclosure. A substrate 200 is provided. The substrate 200 may include a silicon material or another suitable semiconductor material. A material layer 210 is formed over the substrate 200. A photoresist layer 230 is formed over the material layer 210 to pattern the material layer. The photoresist layer 230 is patterned into photoresist layer segments 230A and 230B through a lithography process 250, which as discussed above may be a EUV lithography process or may be a BEUV lithography process. The lithography process 250 is performed using a lithography mask that is implemented as an embodiment of the mask 18 (FIG. 2), which includes an aperiodic ML structure as discussed above with reference to FIG. 3. Again, the aperiodic ML structure allows for improved reflectivity and diffraction balance, which help improve lithography performance.

Figure 5:
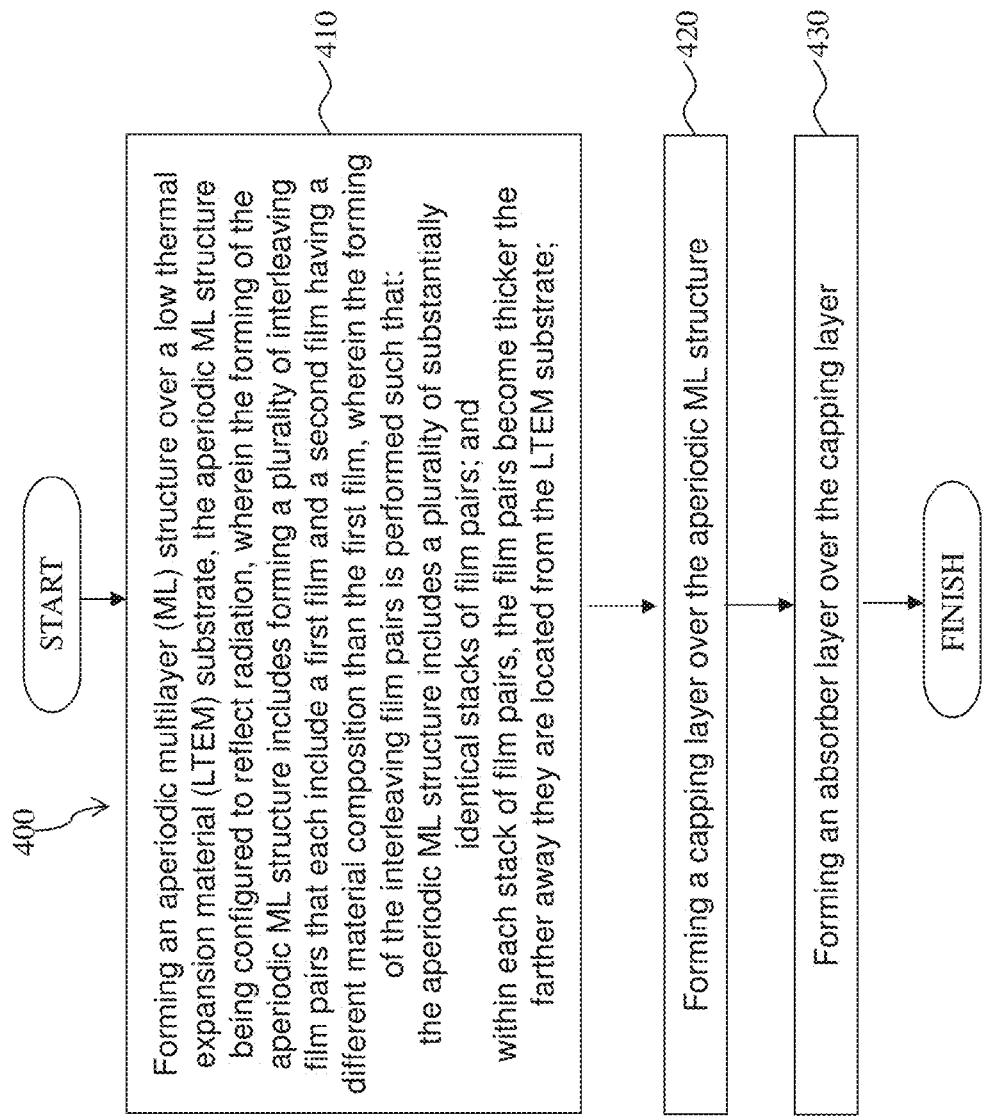
FIG. 5 is a flowchart of a method of fabricating a EUV mask in accordance with some embodiments.

FIG. 5 is a simplified flowchart illustrating a method 400 of fabricating a lithography mask according to an embodiment of the present disclosure. In some embodiments, the lithography mask is a EUV mask. In other embodiments, the lithography mask is a BEUV mask.

The method 400 includes a step 410 of forming an aperiodic multilayer (ML) structure over a low thermal expansion material (LTEM) substrate. The aperiodic ML structure is configured to reflect radiation. The forming of the aperiodic ML structure includes forming a plurality of interleaving film pairs that each include a first film and a second film having a different material composition than the first film. The forming of the interleaving film pairs is performed such that: the aperiodic ML structure includes a plurality of substantially identical stacks of film pairs; and within each stack of film pairs, the film pairs become thicker the farther away they are located from the LTEM substrate. In some embodiments, each stack of the film pairs include a first film pair, a second film pair located over the first film pair, and a third film pair located over the first film pair; the first film pair has a first thickness in a range from about 0.5 d to about d; the second film pair has a second thickness equal to d; and the third film pair has a third thickness in a range from about d to about 1.5 d. In some embodiments, d is about 7 nanometers. In some embodiments, the first film of the film pair contains Mo, and the second film of the film pair contains Si or Be.

The method 400 also includes a step 420 of forming a capping layer over the aperiodic ML structure. In some embodiments, the capping layer contains silicon.

The method 400 includes a step 430 of forming an absorber layer over the capping layer.

It is understood that additional steps may be performed before, during, or after the steps 410-430 shown herein. For example, the method 400 may include a step of forming a buffer layer between the capping layer and the absorber layer. The buffer layer and the absorber layer have different etching characteristics. Additional steps are not specifically discussed herein for reasons of simplicity.

Figure 6:
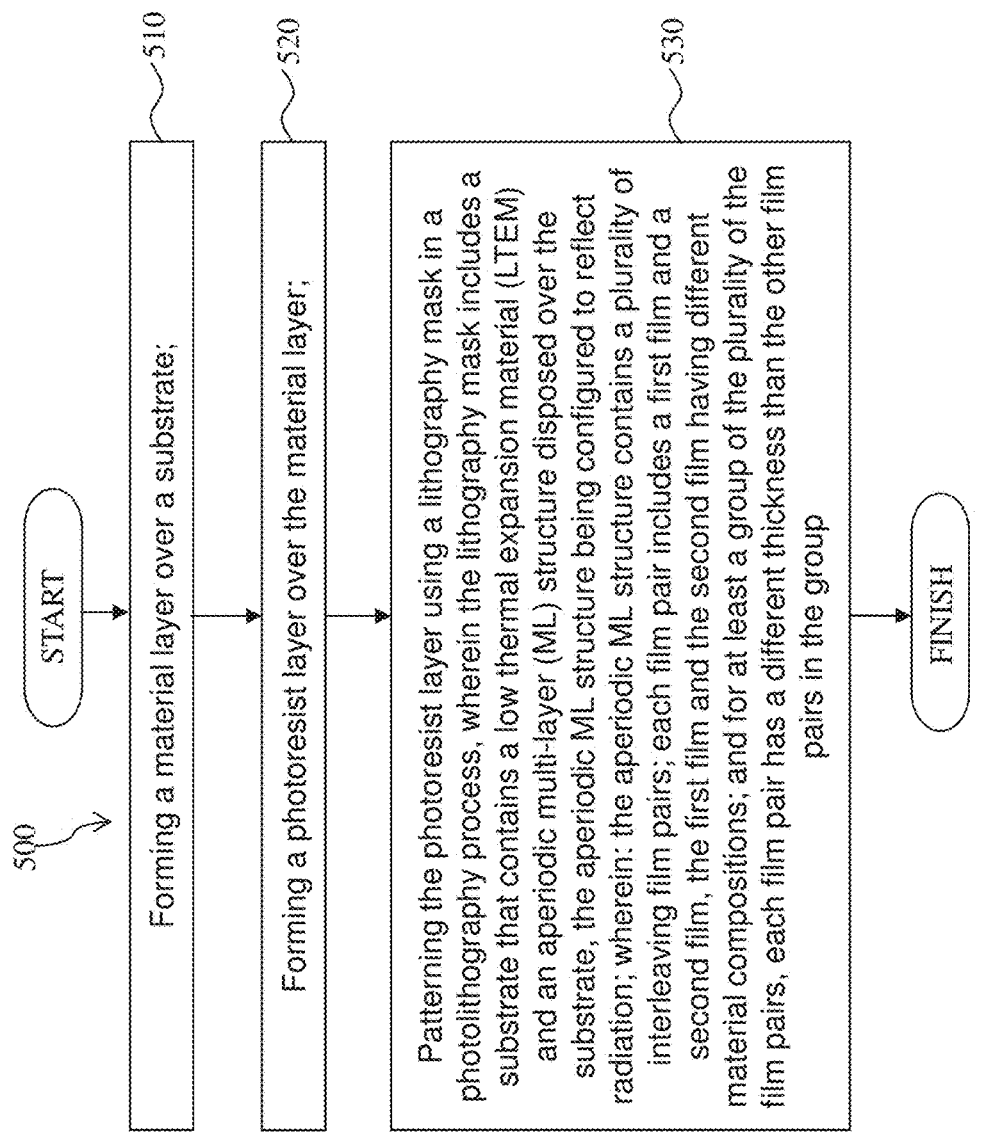
FIG. 6 is a flowchart of a method of wafer manufacturing process in accordance with some embodiments.

FIG. 6 is a simplified flowchart illustrating a method 500 of performing a wafer manufacturing process according to an embodiment of the present disclosure.

The method 500 includes a step 510 of forming a material layer over a substrate. In some embodiments, the material layer contains a dielectric material. In some other embodiments, the material layer contains a metal material.

The method 500 includes a step 520 of forming a photoresist layer over the material layer. The photoresist layer may be formed by a spin-coating process.

The method 500 includes a step 530 of patterning the photoresist layer using a lithography mask in a photolithography process. In some embodiments, the patterning step 530 comprises exposing the photoresist layer to extreme ultraviolet (EUV) radiation or beyond extreme ultraviolet (BEUV) radiation and thereafter developing the exposed photoresist layer to form patterned photoresist features.

The lithography mask includes a substrate that contains a low thermal expansion material (LTEM) and an aperiodic multilayer (ML) structure disposed over the substrate. The aperiodic ML structure is configured to reflect radiation. The aperiodic ML structure contains a plurality of interleaving film pairs. Each film pair includes a first film and a second film, the first film and the second film having different material compositions. For at least a group of the plurality of the film pairs, each film pair has a different thickness than the other film pairs in the group.

In some embodiments, the group of the film pairs include a first film pair, a second film pair formed over the first film pair, and a third film pair formed over the first film pair; the first film pair has a first thickness in a range from about 0.5 d to about d; the second film pair has a second thickness equal to d; and the third film pair has a third thickness in a range from about d to about 1.5 d. In some embodiments, d is about 7 nanometers.

In some embodiments, the aperiodic ML structure includes multiple substantially identical groups of film pairs. Within each group, the thicknesses of the film pairs vary gradually vertically.

In some embodiments, for an entirety of the aperiodic ML structure, the thicknesses of the film pairs change gradually along a predefined direction.

In some embodiments, the lithography mask further comprises: a capping layer disposed over the aperiodic ML structure; and an absorber layer disposed over the capping layer. In some embodiments, the first film of the film pair contains Mo; and the second film of the film pair contains Si or Be.

It is understood that additional steps may be performed before, during, or after the steps 510-530 shown herein. For example, the method 500 may include a step of directing extreme ultraviolet (EUV) or beyond extreme ultraviolet (BEUV) radiation onto the lithography mask via an illuminator. The illuminator may contain a dipole illumination component. Additional steps are not specifically discussed herein for reasons of simplicity.

Based on the above discussions, it can be seen that the present disclosure offers various advantages in EUV/BEUV lithography. It is understood, however, that not all advantages are necessarily discussed herein, and other embodiments may offer different advantages, and that no particular advantage is required for all embodiments. One advantage is that the aperiodic ML structure improves reflectivity and diffraction balance. Whereas conventional lithography masks typically employ a periodic ML structure where all the interleaving film pairs have equal thicknesses, the aperiodic ML structure disclosed herein employ film pairs with gradually changing thicknesses. This allows the reflectivity to be relatively high, while keeping the diffraction imbalance to be relatively low, and it does not impose any restrictions on the numerical aperture. As a result, lithography performance is improved. Another advantage is that the aperiodic ML structure can be formed and used based on existing process flow, as it does not require additional layers or different materials.

The present disclosure provides for a photolithography mask in accordance with some embodiments. The photolithography mask includes a substrate that contains a low thermal expansion material (LTEM). An multilayer (ML) structure is disposed over the substrate. The ML structure is configured to reflect radiation. The ML structure contains a plurality of interleaving film pairs. Each film pair includes a first film and a second film, the first film and the second film having different material compositions. Each film pair has a respective thickness. For at least a subset of the plurality of the film pairs, the respective thicknesses of the film pairs change randomly along a predefined direction.

The present disclosure provides a wafer manufacturing process. A material layer is formed over a substrate. A photoresist layer is formed over the material layer. The photoresist layer is patterned using a lithography mask in a photolithography process. The lithography mask includes a substrate that contains a low thermal expansion material (LTEM) and an multilayer (ML) structure disposed over the substrate. The ML structure is configured to reflect radiation. The ML structure contains a plurality of interleaving film pairs. Each film pair includes a first film and a second film. The first film and the second film having different material compositions. For at least a group of the plurality of the film pairs, each film pair has a different thickness than the other film pairs in the group.

The present disclosure provides for a method of fabricating a photolithography mask. A multilayer (ML) structure is formed over a low thermal expansion material (LTEM) substrate. The ML structure is configured to reflect radiation. The forming of the ML structure includes forming a plurality of interleaving film pairs that each include a first film and a second film having a different material composition than the first film. The forming of the interleaving film pairs is performed such that: the ML structure includes a plurality of substantially identical stacks of film pairs; and within each stack of film pairs, the film pairs become thicker the farther away they are located from the LTEM substrate. A capping layer is formed over the ML structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a first layer;
a second layer disposed over the first layer;
a third layer disposed over the second layer; and
a fourth layer disposed over the third layer;
wherein:
the first layer, the second layer, the third layer, and the fourth layer are layers of a reflective structure of a lithography mask;
the first layer and the second layer combined have a first thickness;
the third layer and the fourth layer combined have a second thickness that is different from the first thickness;
the first layer and the third layer have a first material composition; and
the second layer and the fourth layer have a second material composition different from the first material composition.

2. The structure of claim 1, wherein the lithography mask is an extreme ultraviolet (EUV) lithography mask.

3. The structure of claim 1, wherein the first material compositions includes molybdenum, and wherein the second material composition includes silicon or beryllium.

4. The structure of claim 1, wherein the second thickness is greater than the first thickness.

5. The structure of claim 1, further comprising:
a fifth layer disposed over the fourth layer, the fifth layer having the first material composition; and
a sixth layer disposed over the fifth layer, the sixth layer having the second material composition.

6. The structure of claim 5, wherein the fifth layer and the sixth layer combined have a third thickness that is different from the first thickness and the second thickness.

7. The structure of claim 6, further comprising:
a seventh layer disposed over the sixth layer, the seventh layer having the first material composition; and
an eighth layer disposed over the seventh layer, the eighth layer having the second material composition.

8. The structure of claim 7, wherein:
the seventh layer and the eight layer combined have a fourth thickness;
the first thickness is less than the second thickness;
the second thickness is less than the third thickness; and
the fourth thickness is less than the third thickness.

9. The structure of claim 8, wherein the first thickness is equal to the fourth thickness.

10. A method, comprising:
obtaining a lithography mask that includes a reflective structure for reflecting radiation; and
performing a lithography process using the lithography mask;
wherein:
the reflective structure includes a plurality of first film pairs and a plurality of second film pairs;
each of the first film pairs and the second film pairs includes a first material and a second material different from the first material; and
each of the second film pairs is thicker than each of the first film pairs.

11. The method of claim 10, wherein the performing the lithography process comprises performing an extreme ultraviolet (EUV) process.

12. The method of claim 10, wherein:
the first material includes molybdenum; and
the second material includes silicon or beryllium.

13. The method of claim 10, wherein the reflective structure further includes a plurality of third film pairs that each include the first material and the second material, and wherein each of the third film pairs is thicker than each of the second film pairs.

14. The method of claim 10, wherein the reflective structure includes a plurality of identical stacks, and wherein each of the stacks includes one of the first film pairs and one of the second film pairs.

15. A method, comprising:
forming a first layer over a substrate, the first layer having a first material composition;
forming a second layer over the first layer, the second layer having a second material composition different from the first material composition, wherein the first layer and the second layer are formed to have a combined first thickness;
forming a third layer over the second layer, the third layer having the first material composition;
forming a fourth layer over the third layer, the fourth layer having the second material composition, wherein the third layer and the fourth layer are formed to have a combined second thickness different from the combined first thickness; and
forming a capping layer or an absorber layer over the fourth layer.

16. The method of claim 15, further comprising, before the forming of the capping layer, repeating the forming of the first layer, the forming of the second layer, the forming of the third layer, and the forming of the fourth layer a plurality of times to form a multi-layer reflective structure.

17. The method of claim 15, wherein the forming of the first layer includes forming the first layer over a substrate that contains $TiO_2$ doped $SiO_2$.

18. The method of claim 15, wherein the first material compositions includes molybdenum, and wherein the second material composition includes silicon or beryllium.

19. The method of claim 15, further comprising:
forming a fifth layer over the fourth layer, the fifth layer having the first material composition; and
forming a sixth layer over the fifth layer, the sixth layer having the second material composition, wherein the fifth layer and the sixth layer are formed to have a combined third thickness that is different from the combined first thickness and the combined second thickness.

20. The method of claim 19, wherein:
the combined first thickness is smaller than the combined second thickness; and
the combined second thickness is smaller than the combined third thickness.

* * * * *